United States Patent [19]

Spitzer

[11] Patent Number: 4,676,845
[45] Date of Patent: Jun. 30, 1987

[54] PASSIVATED DEEP P/N JUNCTION

[75] Inventor: Mark B. Spitzer, Lexington, Mass.

[73] Assignee: Spire Corporation, Bedford, Mass.

[21] Appl. No.: 829,947

[22] Filed: Feb. 18, 1986

[51] Int. Cl.[4] .................. H01L 29/12; H01L 31/06
[52] U.S. Cl. ........................... 148/33.3; 136/255;
    136/261; 148/1.5; 148/176; 357/30; 357/91
[58] Field of Search ............... 148/1.5, 176, 33, 33.3;
    136/255, 261; 357/30, 91

[56] References Cited

PUBLICATIONS

J. A. Minnucci et al, *IEEE Transactions on Electron Devices*, vol. ED-27, pp. 802-806 (1980).
A. Usami et al, *Conf. Record, 17th IEEE Photovoltaic Specialists Conf.* (1984), pp. 547-552.
C. T. Ho et al, *Solar Cells*, vol. 11, pp. 29-39 (1984).
M. P. Godlewski et al, *Conf. Record, 14th IEEE Photovoltaic Specialists Conf.*, (1980), pp. 166-171.
R. A. Arndt et al, *Conf. Record, 15th IEEE Photovoltaic Specialists Conf.* (1981), pp. 92-96.

V. E. Lowe et al, *IEEE Transactions on Electron Devices*, vol. ED-31 (No. 5), May 1984, pp. 626-629.

Primary Examiner—Aaron Weisstuch
Attorney, Agent, or Firm—Morse, Altman & Dacey

[57] ABSTRACT

A passivated deep p/n junction obtained by ion implantation is disclosed. The passivated deep p/n junction is formed in a wafer, preferably a silicon wafer, thus providing an emitter region that is both lightly doped and extending to a depth of about one micrometer. The emitter region in turn is provided with a surface layer so as to reduce surface recombination. Preferably, the surface layer is a silicon oxide layer of about 0.01 micrometer thickness. The p/n junction is obtained by ion implantation whereby the dopant is introduced at room temperature and then distributed thermally. The surface layer preferably is formed near the end of the thermal distribution by admitting a small amount of dry oxygen to a gas stream, and passing the gas stream along the surface of the wafer.

5 Claims, 5 Drawing Figures

PASSIVATED DEEP P/N JUNCTION

BACKGROUND OF THE INVENTION

1. Field of the Invention

The present invention relates generally to solar cells and, more particularly, to a passivated deep p/n junction obtained in a wafer by ion implantation.

2. The Prior Art

Currently, solar cells for the most part are made with shallow p/n junctions on the order of about 0.3 micrometer, which junction is highly doped. A p/n junction is required in a solar cell to collect the photogenerated carriers. A suitable wafer of one type, say p-type, is provided with an opposite type surface layer, say n-type, about 0.3 micrometer deep, to effect such a p/n junction between the wafer and the surface layer. The doping of this surface layer also needs to lower the surface sheet resistance of the wafer to levels low enough to allow for conduction of the photo-generated current carriers to a solar cell grid contact formed on the wafer's surface without appreciable ohmic losses thereat. In order to achieve this desired end, present day solar cell technology utilizes, for the most part, doping levels in excess of $10^{20}$ cm$^{-3}$ so as to yield a wafer sheet resistance of less than 100 ohms per square.

A basic problem encountered with this present day solar cell technology is that in the case of doping levels in excess of $10^{20}$ cm$^{-3}$, the lifetime of the minority photogenerated current carriers in the surface-doped region of the wafer (i.e., in the emitter region of the solar cell) is so short that an appreciable percentage of such minority photogenerated current carriers escape from being collected by the p/n junction due to rapid bulk recombination, such as doping-dependent Auger recombination. As a consequence, the conversion efficiency of the solar cell is adversely affected. Some workers in the field have attempted to alleviate this problem by making the p/n junction even shallower than 0.3 micrometer and increasing the level of doping in the emitter region still further. As known, a decrease in the p/n junction depth increases the sheet resistance. Such increased sheet resistance is, of course, compensated for by the heavier doping in the emitter region. Thus, sheet resistance is maintained below 100 ohms per square. Since the p/n junction is shallower, however, more photons penetrate the emitter, with the consequence that more current carriers are photogenerated in the base region of the cell, where they can be collected and conversely, less current carriers are photogenerated in the emitter region, where a large percentage thereof is lost. Since the p/n junction is very shallow however, more often than not reliable metallic electric contacts to the front surface of the solar cell cannot be effected. This problem of reliability is due to the fact that the metallic electric contacts must be made to react with the front surface of the solar cell so as to properly adhere thereto. When the p/n junction is too shallow, however, the metallization reaction on the front surface of the cell will penetrate this shallow emitter region, cross over the p/n junction and introduce deleterious shunt resistance into the solar cell.

SUMMARY OF THE INVENTION

It is a principal object of the present invention to overcome the above disadvantages by providing a passivated deep p/n junction in a wafer obtained therein by ion implantion, which wafer exhibits good compatibility with front surface contact metallization and results in a solar cell of improved conversion efficiency.

More specifically, it is an object of the present invention to provide a wafer with a passivated deep p/n junction formed therein by ion implantation, which junction also is lightly doped. Due to the depth of the p/n junction, the front surface metallization penetration problem is eliminated, and the formation of reliable front surface electric contacts assured. At the same time, due to the reduced doping level in the emitter region of the resultant solar cell, the lifetimes of the photogenerated minority current carriers are now of sufficient duration such that nearly all such current carriers are now collected, resulting in a solar cell of much improved conversion efficiency. Although the reduced doping level in the emitter region increases the surface sheet resistance, nevertheless due to the greater depth of the p/n junction, a sheet resistance of less that 100 ohms per square is easily obtained. The passivated deep p/n junction formed in the wafer by ion implantation comprises providing a suitable wafer, such as a silicon wafer or the like, of either p or n type, forming a lightly doped emitter region in one surface of the wafer by ion implantation of a dopant material of an opposite type from that forming the wafer, thermally distributing the ion implanted dopant material to form the deep p/n junction therein, the emitter region extending into the wafer surface to a depth of about one micrometer, and passivating the deep p/n junction by forming a thin surface layer on the emitter region designed to suppress surface recombination of the photogenerated current carriers. The passivated deep p/n function can be formed in the wafer in one of two preferred ways. In a first preferred way, the ion implantation of the dopant material is effected to a shallow depth only, followed by a thermal distribution of about thirty minutes and at a temperature range of about 850° C. to about 1100° C. In a second pereferred way, the ion implantation of the dopant material is effected to a greater depth, followed by a shorter thermal distribution of about fifteen minutes and at a temperature range of about 750° C. to about 1000° C. Preferably, the thin surface layer is formed near the end of the thermal distribution of the implanted dopant material, preferably by admitting dry oxygen to a gas stream flowing along the surface of the wafer.

Other objects of the present invention will in part be obvious and will in part appear hereinafter.

The invention accordingly comprises the passivated deep p/n junction of the present disclosure, obtained in a wafer by ion implantation its components, parts and their interrelationships, the scope of which will be indicated in the appended claims.

BRIEF DESCRIPTION OF THE DRAWINGS

For a fuller understanding of the nature and objects of the present invention, reference is to be made to the following detailed description, which is to be taken in connection with the accompanying drawings, wherein.

DETAILED DESCRIPTION OF THE PREFERRED EMBODIMENT

In general, the present invention relates to a passivated deep p/n junction obtained by ion implantation in a wafer 10. The implanted wafer 10 is useful in solar cell applications due to its compatibility with metallization and results in a solar cell of improved conversion efficiency. This improved conversion efficiency of a solar cell manufactured from the wafer 10 is achieved first by limiting the implanted doping concentration, second by making the p/n junction deep to effect metallization reliability and to increase the sheet conductivity and, third by combining the deep p/n junction with passivation so as to reduce surface recombination of photogenerated current carriers to a negligible minimum. The passivated deep p/n junction obtained by ion implantation in the wafer 10 also improves the production yield in solar cell fabrication, and extends the range of temperature to which the metallized device can be subjected to without degradation.

Figure 1:
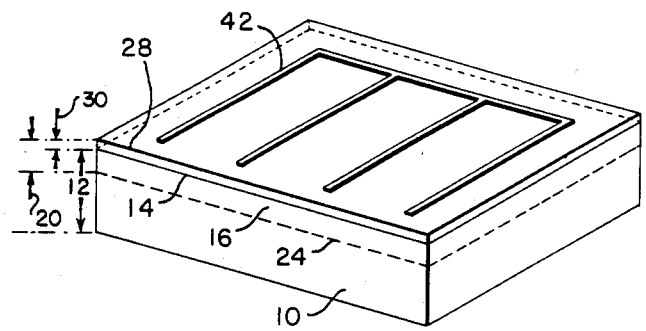
FIG. 1 is an isometric perspective view of a wafer provided with a passivated deep p/n junction according to the present invention.

An isometric perspective view of the wafer 10 is shown in FIG. 1. The wafer 10 preferably is formed of silicon, such as a single-crystal silicon or the like. Further, the wafer 10 is formed with a thickness 12 ranging from about 50 micrometers to about 500 micrometers, with a preferred thickness 12 of about 300 micrometers. The wafer 10 otherwise may be cut to any of the conventional sizes, such as 2"×2", 3"×3", 5"×5", or the like, or may be round, intended for an image produced by a solar cell concentrating lens. On a front surface 14 of the wafer 10, an emitter region 16 is formed by ion implantation of dopant atoms 18 of a type opposite to that present in the wafer 10. This ion implantation of the dopant atoms 18 is effected to a depth 20 of between about one-tenth and about one micrometer below the front surface 14 of the wafer 10, with the thermal distribution determining the ultimate depth. It is to be noted that the deeper is the ion implantation of the dopant atoms 18, the lesser time and lower temperature it takes for the thermal distribution to achieve this ultimate depth. Since it is a feature of the invention that this emitter region 16 be lightly doped, the dopant concentration of the emitter region 16 is not to exceed about $10^{19}$ cm$^{-3}$.

Figure 2:
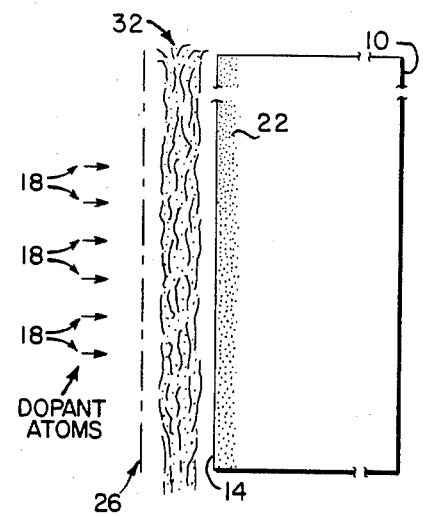
FIG. 2 is a schematic representation of obtaining the passivated deep p/n junction in the wafer of FIG. 1 by ion implantation.

Ion implantation is a precise, well-controlled process which is effected at room temperature. Preferably, the ion implantation of the dopant atoms 18 is effected at room temperature in an energy range of between about 5 keV and about 50 keV, and with a dose of about $10^{15}$ ions per cm$^2$. The precision of implantation, both as to depth and location, easily can be maintained in production. Following the introduction of the dopant atoms 18 in the desired light dopant concentration and to about the desired depth 20 below the surface 14 of the wafer 10, the ion implanted dopant atoms 22 are then thermally distributed within the emitter region 16, forming thereby a deep p/n junction 24 about one micrometer below the front surface 14. This thermal distribution of the deeply implanted dopant atoms 22 within the emitter region 16 of the wafer 10 preferably is effected by exposing the wafer surface 14 to heat, as schematically illustrated in FIG. 2 at 26, raising thereby the temperature of the wafer surface 14 to at least about 750° C., and preferably within a range of about 750° C. to about 1000° C., and maintaining the selected temperature for at least about fifteen minutes, and preferably within a time frame from about fifteen minutes to about two hours. The thermal distribution simultaneously anneals any crystal damage introduced by the ion beam.

In order to reduce surface recombination of the photogenerated current carriers to negligible levels, the front surface 14 of the wafer 10 is provided with a thin surface layer 28. This surface layer 28 is about 0.01 micrometer thick, as indicated at 30. Preferably, the thin surface layer 28 is formed as an integral step of the thermal distribution of the implanted dopants 22 by admitting dry oxygen (O$_2$) to a gas stream 32, and passing the gas stream 32, carrying the dry oxygen, along the heated surface 14 of the wafer 10, as shown in FIG. 2. Since preferably the wafer 10 is made from silicon, the thin surface layer 28 will form as a silicon dioxide (SiO$_2$) layer.

Figure 3:
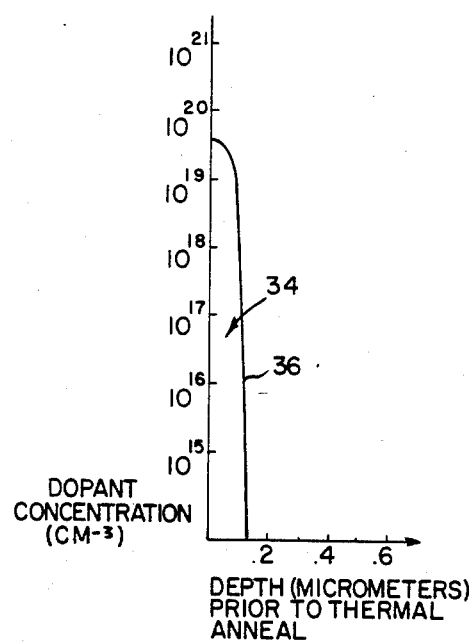
FIGS. 3 and 4 are graphs useful in understanding certain principles of the invention.
Figure 4:
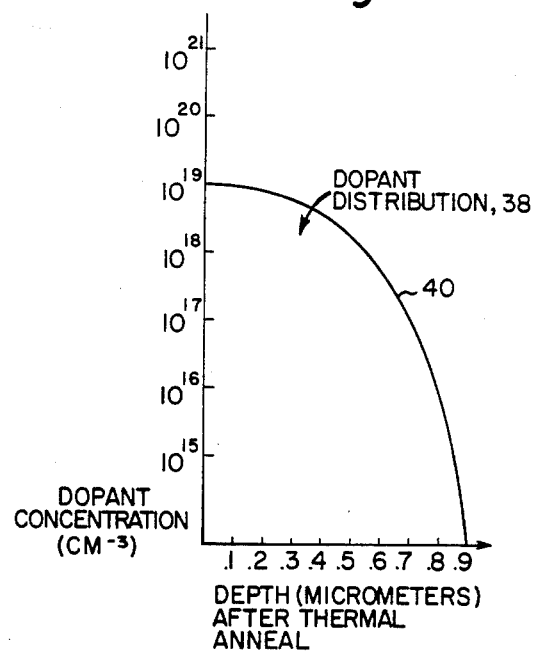
Figure 5:
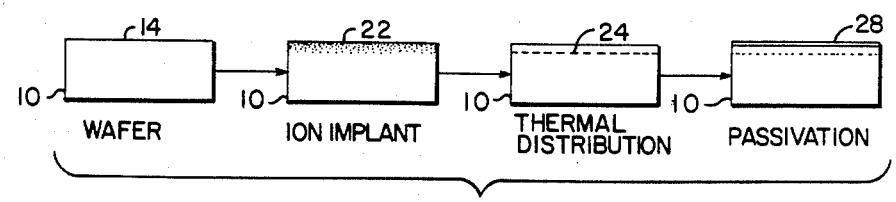
FIG. 5 depicts a wafer and the various steps it undergoes before it becomes the wafer shown in FIG. 1.

FIG. 3 illustrates ion implantation of dopant atoms 18 wherein a precise quantity of ions 34, indicated as being to the left of curve 36, are first shallowly implanted just immediately below the front surface 14 of the wafer 10, with the implantation being effected at room temperature. FIG. 4 illustrates the effects of a thermal distribution 38 of the implanted dopant atoms 22, indicated as being to the left of a curve 40, so as to form the deep p/n junction 24. This thermal distribution of the implanted dopant atoms 22 is effected at a temperature of at least about 800° C., preferably in the range of 850° C. to 1100° C., and for a time period of at least about thirty minutes, and preferably in the range of about thirty minutes to about three hours. It will be noted that the dopant concentration after the thermal distribution 38 as indicated by the curve 40, does not exceed $10^{19}$ cm$^{-3}$. After the formation of the passivation layer 28, a front surface metallic collection grid 42 is formed thereon by any conventional method, as for example, by evaporation. The front surface metallic collection grid 42 is formed through the passivation layer 28 so as to form, in the end, a conventional NP or PN type solar cell therefrom.

Thus it has been shown and described a wafer 10 provided with a passivated deep p/n junction 24 formed in the wafer 10 by ion implantation, which wafer 10 is useful in solar cell applications and satisfies the objects and advantages set forth above.

Since certain changes may be made in the present disclosure without departing from the scope of the present invention, it is intended that all matter described in the foregoing specification or shown in the accompanying drawings, be interpreted in an illustrative and not in a limiting sense.

What is claimed is:

1. A semiconductor wafer with a passivated deep p/n junction obtained by ion implantation, comprising the steps of:
  (a) providing a semiconductor wafer;
  (b) forming a lightly doped emitter region by ion implantation of a dopant material in one surface of said wafer to a depth of about one micrometer;
  (c) thermally distributing said ion implanted dopant material to form said deep p/n junction; and
  (d) passivating said deep p/n junction by forming a surface layer on said emitter region;
  said lightly doped emitter region having a dopant concentration of no more than about $10^{19}$ cm$^{-3}$; and
  said ion implantation of said dopant material being effected at room temperature and within an energy range of between 5 keV and 50 keV and with a dose of about $10^{15}$ ions per cm$^2$.

2. The wafer with a passivated deep p/n junction of claim 1 wherein said wafer is a silicon wafer of a thickness from about 50 micrometers to about 500 micrometers, wherein said surface layer is formed of silicon dioxide, and wherein said surface layer is about 0.01 micrometer thick.

3. The wafer with a passivated deep p/n junction of claim 2 wherein said silicon dioxide surface layer is formed as an integral step of said thermal distribution step of said ion implanted dopant material by admitting dry oxygen to a gas stream and passing said gas stream and dry oxygen along the surface of said lightly doped emitter region.

4. The wafer with a passivated deep p/n junction of claim 1 wherein said thermal distribution of said ion implanted dopant material is effected at a temperature of at least about 750° C., and wherein said thermal distribution of said ion implanted dopant material is effected over a time period of at least about fifteen minutes.

5. The wafer with a passivated deep p/n junction of claim 1 wherein said surface layer is formed as an integral step of said theremal distribution step of said ion implanted dopant material.

* * * * *